(12) United States Patent
Bakalski (10) Patent No.: US 9,281,802 B2
(45) Date of Patent: Mar. 8, 2016

(54) SYSTEM AND METHOD FOR A SWITCHABLE CAPACITANCE

(71) Applicant: Infineon Technologies AG, Neubiberg (DE)

(72) Inventor: Winfried Bakalski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/894,096

(22) Filed: May 14, 2013

(65) Prior Publication Data

US 2014/0340181 A1    Nov. 20, 2014

(51) Int. Cl.
*H03L 5/00* (2006.01)
*H03J 5/24* (2006.01)

(52) U.S. Cl.
CPC ............ *H03J 5/244* (2013.01); *H03J 2200/10* (2013.01)

(58) Field of Classification Search
CPC .............................. H03J 5/244; H03J 2200/10
USPC ........ 327/308, 365, 552–559; 455/78; 334/55
See application file for complete search history.

(56) References Cited

U.S. PATENT DOCUMENTS 7,848,712 B2 * 12/2010 Fu et al. ........................ 455/80
8,638,159 B2 *  1/2014 Ranta et al. ................. 327/427

OTHER PUBLICATIONS

Steel, Victor, et al., "Tunable RF Technology Overview," Microwave Journal Frequency Matters, Nov. 15, 2012, 8 pages.

* cited by examiner

*Primary Examiner* — Dinh Le
(74) *Attorney, Agent, or Firm* — Slater & Matsil, L.L.P.

(57) ABSTRACT

In accordance with an embodiment, a switchable capacitance circuit includes a plurality of capacitance-switch cells that each has a first semiconductor switching circuit and a capacitance circuit having a first terminal coupled to the first semiconductor switching circuit. A resistance of the first semiconductor switching circuit of a first switch-capacitance cell of the plurality of capacitance-switch cells is within a first tolerance of a resistance of the first semiconductor switching circuit of a second capacitance-switch cell of the plurality of capacitance-switch cells, and a capacitance of the capacitance circuit of the first capacitance-switch cell is within a second tolerance of a capacitance of the capacitance circuit of the second capacitance-switch cell.

21 Claims, 9 Drawing Sheets

SYSTEM AND METHOD FOR A SWITCHABLE CAPACITANCE

TECHNICAL FIELD

The present disclosure relates generally to an electronic device, and more particularly to a system and method for a switchable capacitance.

BACKGROUND

Tunable passive elements, such as capacitors and inductors, are used in a variety of radio frequency (RF) circuits to implement adjustable matching networks for antennas and power amplifiers, and to provide adjusting tuning for high frequency filters. Due to the high demand and production of portable devices, such tunable passive elements may be found in products such as cellular telephones, smart phones and portable computers. Providing tuning to RF circuits in such products allows these products to provide high performance RF transmission and reception in a variety of RF conditions. Programmable tuning is also helpful in RF devices that are configured to operate over different RF bands and/or configured to operate using different standards.

Tunable capacitors may be implemented in a number of ways. For example, a voltage-controlled capacitor may be used to provide a variable capacitance. Such a variable capacitance may be implemented using a reverse-biased diode junction having a capacitance that is inversely proportional to the applied reverse bias voltage. Another way in which a tunable capacitance may be implemented is by using an array of switchable capacitors whose various elements are either connected or disconnected via controllable switches. One challenge in the design of a switchable capacitor is maintaining a high quality factor (Q), which may be degraded by the resistance of the controllable switches.

SUMMARY OF THE INVENTION

In accordance with an embodiment, a switchable capacitance circuit includes a plurality of capacitance-switch cells that each has a first semiconductor switching circuit and a capacitance circuit having a first terminal coupled to the first semiconductor switching circuit. A resistance of the first semiconductor switching circuit of a first switch-capacitance cell of the plurality of capacitance-switch cells is within a first tolerance of a resistance of the first semiconductor switching circuit of a second capacitance-switch cell of the plurality of capacitance-switch cells, and a capacitance of the capacitance circuit of the first capacitance-switch cell is within a second tolerance of a capacitance of the capacitance circuit of the second capacitance-switch cell.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a switchable capacitance that may be used in RF circuits to provide tuning for antennas, matching networks and filters. The invention may also be applied to other systems and applications including other circuits that utilize a programmable capacitance such as digitally tunable oscillators to enable a wide output frequency range and charge-pumps to enable variable frequency operation.

Figure 1A:
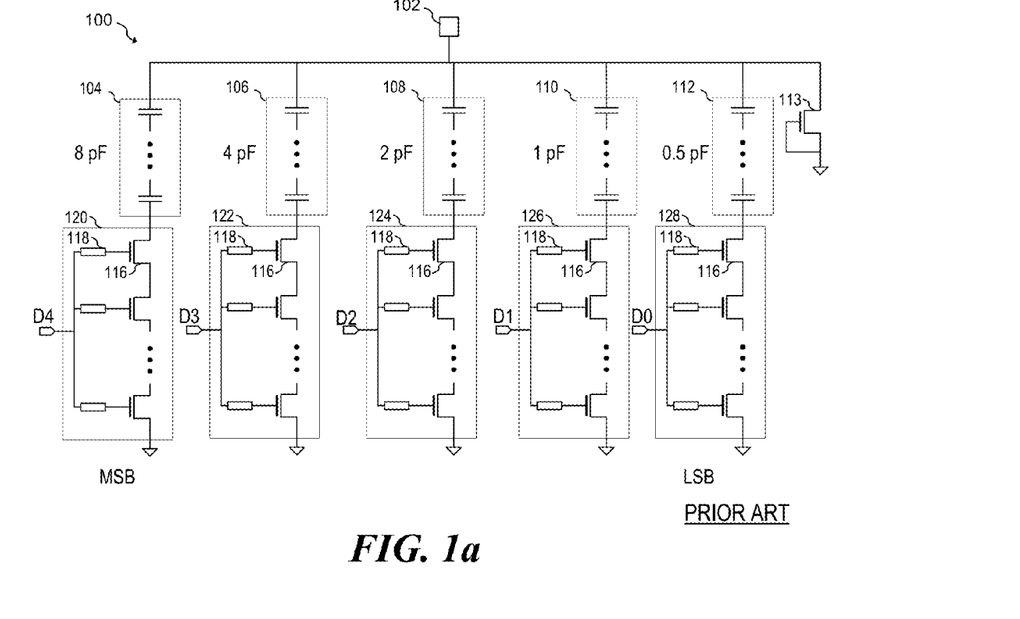
FIGS. 1a-c illustrate schematics and a corresponding performance graph of a conventional digitally tunable capacitance.

FIG. 1a illustrates a conventional digitally tunable capacitor circuit 100 that includes binary weighted capacitances 104, 106, 108, 110 and 112, each of which is coupled to series switches 120, 122, 124, 126 and 128 respectively. The values of capacitances 104, 106, 108, 110 and 112 are 8 pF, 4 pF, 2 pF, 1 pF and 0.5 pF, respectively. Each of capacitors 104, 106, 108, 110 and 112 are coupled to output pad 102, as well as to electrostatic discharge (ESD) protection transistor 113. The amount of capacitance seen at output pad 102 is controllable using digital signals D4, D3, D2, D1 and D0. For example, if signal D3 is at a logic high, thereby turning on series switch 122, and signals D4, D2, D1, and D0 or low, thereby turning off switches 120, 124, 126 and 128, then the capacitive load seen at pad 102 is about 4 pF. Likewise, if all signals D3, D2, D1 and D0 are at logic high, then the load seen by the output pad 102 is about 15.5 pF.

Many systems that utilize digitally tunable capacitors may be subject to higher voltages across the digitally tunable capacitor. One example of this is the antenna interface of a cellular telephone. For example, the transmitter of the cellular telephone may output about 33 dBm of power into 50 ohms, which corresponds to a voltage of about 20 V. At the antenna interface, however, there may be impedances that far exceed 50 ohms, thereby creating transient voltages in the 50 V to 60 V range. Because devices in many semiconductor processes may only be able to withstand voltages in the 10 V range, device stacking is used to prevent device breakdown and destruction. As shown, each of capacitors 104, 106, 108, 110 and 112 are implemented using a series combination of capacitors. Likewise, each of series switches 120, 122, 124, 126 and 128 are implemented using series connected transistors 116, each of which has resistor 118 coupled in series with its gate. Resistors 118 keep the gate impedance high enough so as not to influence the RF impedance of the capacitor-switch combination.

One important figure of merit for a capacitor is the Q factor, which is defined as:

$$Q = \frac{\operatorname{Im}(Z)}{\operatorname{Re}(Z)},$$

where Z is the complex impedance of the capacitive element, Im(Z) is the imaginary component of the impedance, and Re(Z) is real component of the impedance. In in the case of a capacitor coupled in series with a switch, the following approximation can be made:

$$\operatorname{Im}(Z) = \operatorname{Im}\left(\frac{1}{j\omega C}\right) = \frac{1}{\omega C},$$

$$\operatorname{Re}(Z) = Ron,$$

wherein C is the value of the capacitance, Ron is the on resistance of the switch and w is the angular frequency. Therefore, the Q of the capacitor can be expressed as:

$$Q = \frac{\left(\frac{1}{\omega C}\right)}{Ron}$$

As is apparent above, the Q factor improves as C or Ron decreases. Therefore, the more series connected devices, there are, the lower the Q factor.

Figure 1B:
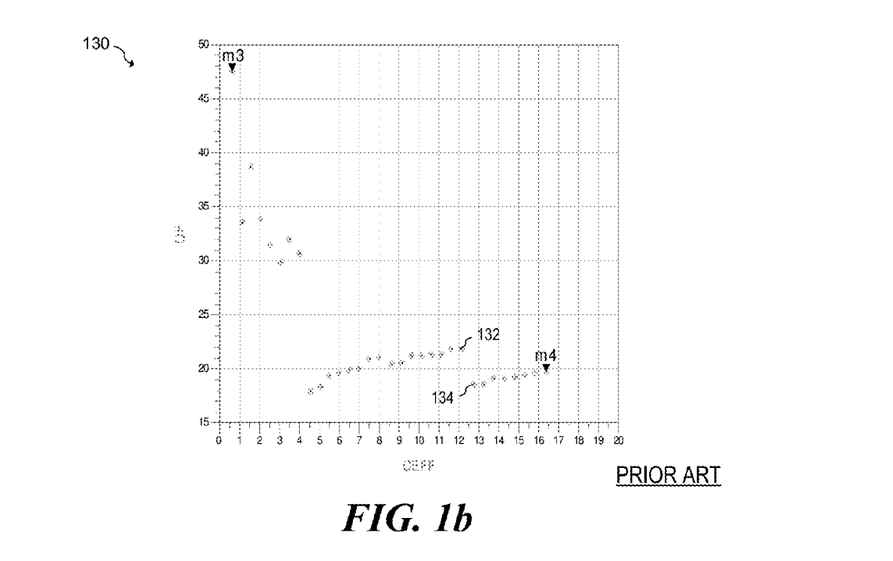

FIG. 1*b* illustrates a plot 130 of Q factor versus effective of capacitance for a 5-bit switched binary weighted capacitor array. As shown, the Q factor varies considerably over output capacitance CEFF. For example, the Q factor at point 132 corresponding to a capacitance of about 12 pF, while the Q factor at point 134 corresponding to a capacitance of about 12.5 pF is about 19. This variation in Q factor is due to variations in the ratio between C and Ron for each branch. If the Q factor were made more constant by equalizing the ratio between C and Ron for each branch, other difficulties would ensure. For example, a very wide low resistance switch would be needed for the highest capacitor, and a very small and/or long and narrow transistor would be needed for the smaller transistors. This difference in switch dimensions could consume overall more die area, and could cause issues with respect to current distribution. Switches having a number of high resistance transistors in series may have difficulty fully turning-on, and the turn-on time may vary considerably between branches of different capacitor sizes and switch resistances.

Figure 1C:
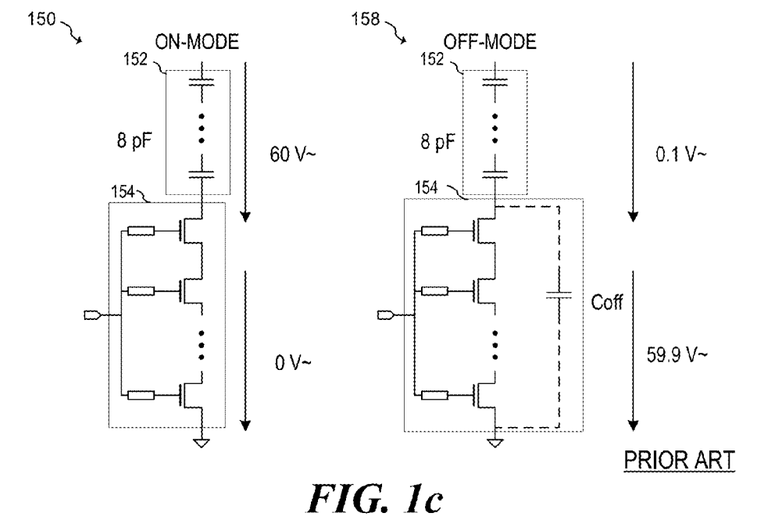

FIG. 1*c* illustrates the effect of a 60 VAC applied across switch 154 with 8 pF of capacitance 152 coupled in series. Diagram 150 represents the case when switch 154 is on, and diagram 158 represents the case when switch 154 is off. As shown, when switch 154 is on, there is about 0 V of AC voltage applied across switch 154, and the full 60 VAC is seen by capacitor 152. When switch 154 is off, however, about 0.1 V is seen by capacitance 152 and about 59.9 V is seen by switch 154 via capacitive coupling. Even though switch 154 is not DC coupled to the applied voltage, switch 154 still needs to withstand almost the entire applied voltage swing because of the voltage coupled via capacitance 152.

Figure 2A:
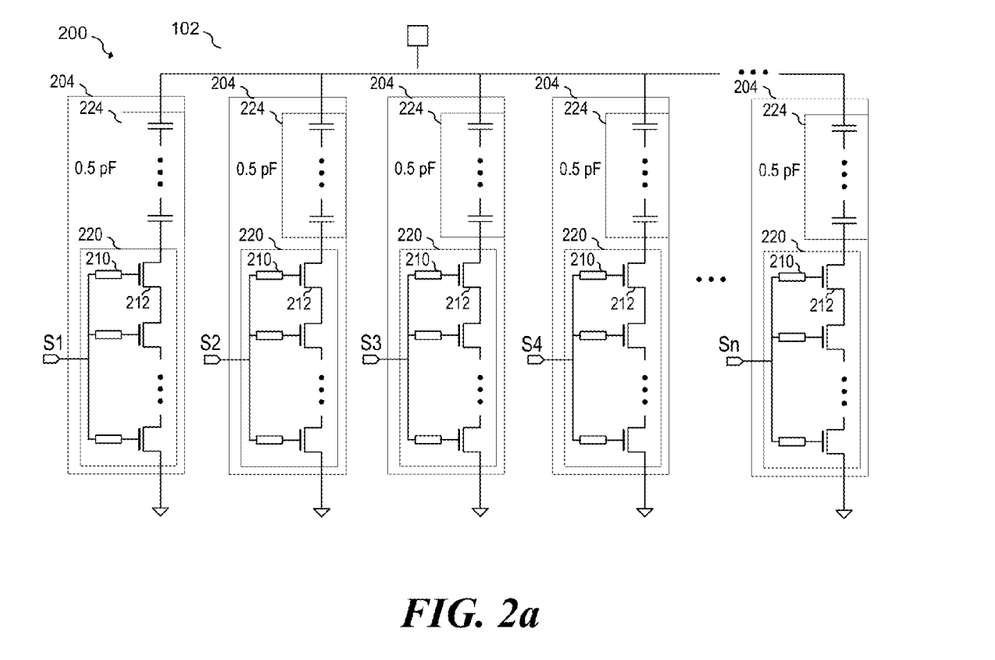
FIGS. 2a-c illustrate schematics and a corresponding performance graph of a conventional digitally tunable capacitance.

FIG. 2*a* illustrates digitally tunable capacitor circuit 200 according to an embodiment of the present invention, which includes equally weighted capacitance-switch cells 204 coupled to output pad 102. Each circuit 204 includes capacitance 224 coupled in series with switch circuit 220. In the illustrated example, capacitance 224 is about 0.5 pF that is formed by a series combination of capacitors. In one example, capacitance 224 is formed by coupling five 2.5 pF capacitors in series to form an equivalent capacitance of 0.5 pF. Alternatively, greater or few capacitors may be coupled in series depending on the particular system and its specifications. In some embodiments, a single capacitance may be used. Switch 220 is formed by a series combination of transistors 212, each having resistors 210 in series with its gate. As explained above, this series resistance keeps the gate impedance high enough so as not to influence the RF impedance of capacitor switch combination 204.

Transistors 212 may be implemented, for example, using CMOS switching transistors. As shown, NMOS transistors are used, however, PMOS transistors or CMOS transmission gates including both a PMOS transistor and NMOS transistor in parallel may also be used. In alternative embodiments, other transistor types may be used including, but not limited to bipolar transistors, and JFETs. The capacitors within capacitance 224 may be implemented using metal-insulator-metal (MIM) capacitors. Each capacitance 224 may include a plurality of capacitors coupled in series. In alternative embodiments, a single capacitor may be used, for example, in embodiments in which a single capacitor can withstand the maximum applied AC voltage swing.

In an embodiment, each capacitor-switch combination 204 may be activated or deactivated via respective control lines S1, S2, S3, S4 and Sn using thermometer coded activation methods. For example, if 2.5 pF of capacitance are needed, four switches are activated. If, on the other hand, only 0.5 pF is needed, only one switches activated.

Capacitance-switch combination 204 is constructed using a same matched cell. In other words, the number of components in series and the geometry of the particular components are selected to be the same. By using the same geometries and values, the Q factor may be kept more constant over the applied digitally selective capacitance value. Moreover, the switching time for each capacitor switch combination 204 is also about the same. It should be understood that in some alternative embodiments, some of the cells may be implemented using different values and geometries, for example, to calibrate and/or to provide fine tuning the output capacitance values. In some embodiments, the resistance of switches 220 are within a first tolerance of each other and the capacitance of capacitors 224 are within a second tolerance of each other. In some cases, the first and second tolerances may be less than 10% or less than 5%. Alternatively, the first and second tolerances may be less than 1% and/or such that the resistance of switches 220 are substantially equal to each other and the capacitances of capacitors 224 are substantially equal to each other.

Figure 2B:
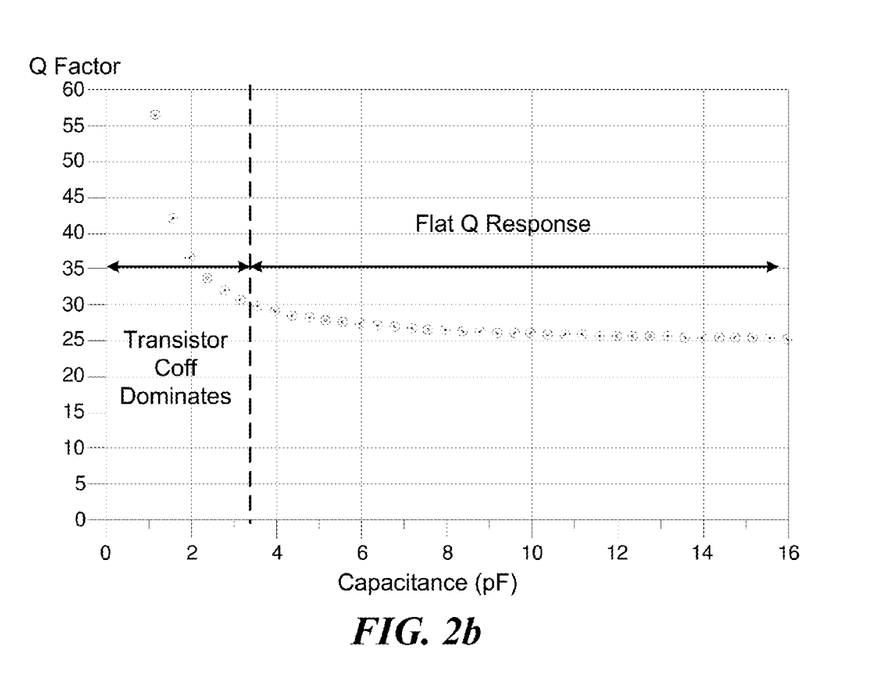

FIG. 2*b* illustrates a plot of Q factor versus output capacitance value measured at 800 MHz for an embodiment having 40 capacitance-switch cells of about 0.4 pF each. As shown, the Q factor is about 25 or greater, and the curve of Q factor versus capacitance is smooth and substantially monotonic. At capacitances above about 3 pF, the Q factor is relatively flat with respect to capacitance. At lower capacitances, the Q factor is higher due to small capacitance values and because the parasitic capacitance of the switches begins to dominate the capacitance.

Figure 2C:
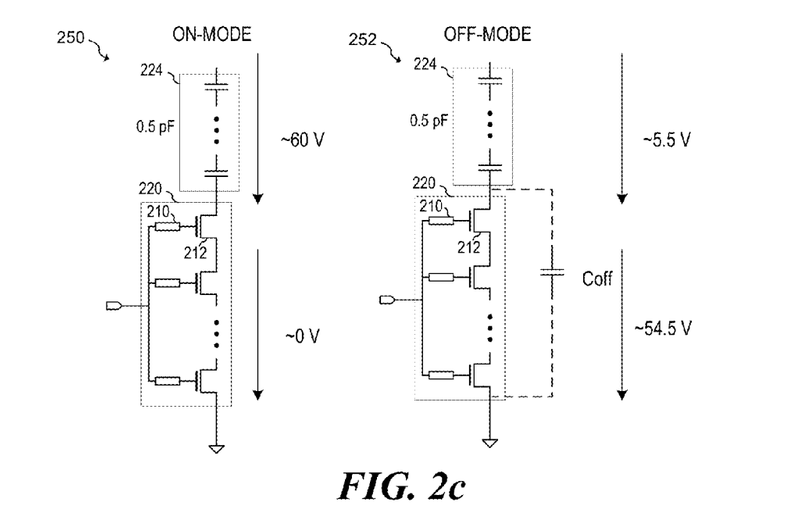

FIG. 2c illustrates the effect of a 60 VAC applied across embodiment switch 220 with 0.5 pF equivalent capacitor 224 coupled in series. Capacitance-switch combination 250 represents the case when switch 220 is on, and capacitance-switch combination 252 represents the case when switch 220 is off. As shown, when switch 220 is on, there is about 0 V of AC voltage applied across switch 220, and the full 60 VAC is seen by capacitor 224. When switch 220 is off, however, about 5.5 V is seen by capacitor 224 and about 54.5 V is seen by switch 220 via capacitive coupling. Parasitic capacitance Coff is about 50 fF in this example. The 54.5 V seen by switch 220 is less than the 59.9 V seen by switch 154 (FIG. 1c) because capacitance 224 is has a lower capacitance (0.5 pF) than capacitance 152 (8 pF), thereby causing less capacitive coupling of the applied voltage when switch 220 is off. In some embodiments, by using a lower series capacitance, fewer transistors need to be coupled in series to withstand the coupled applied voltage.

Figure 3:
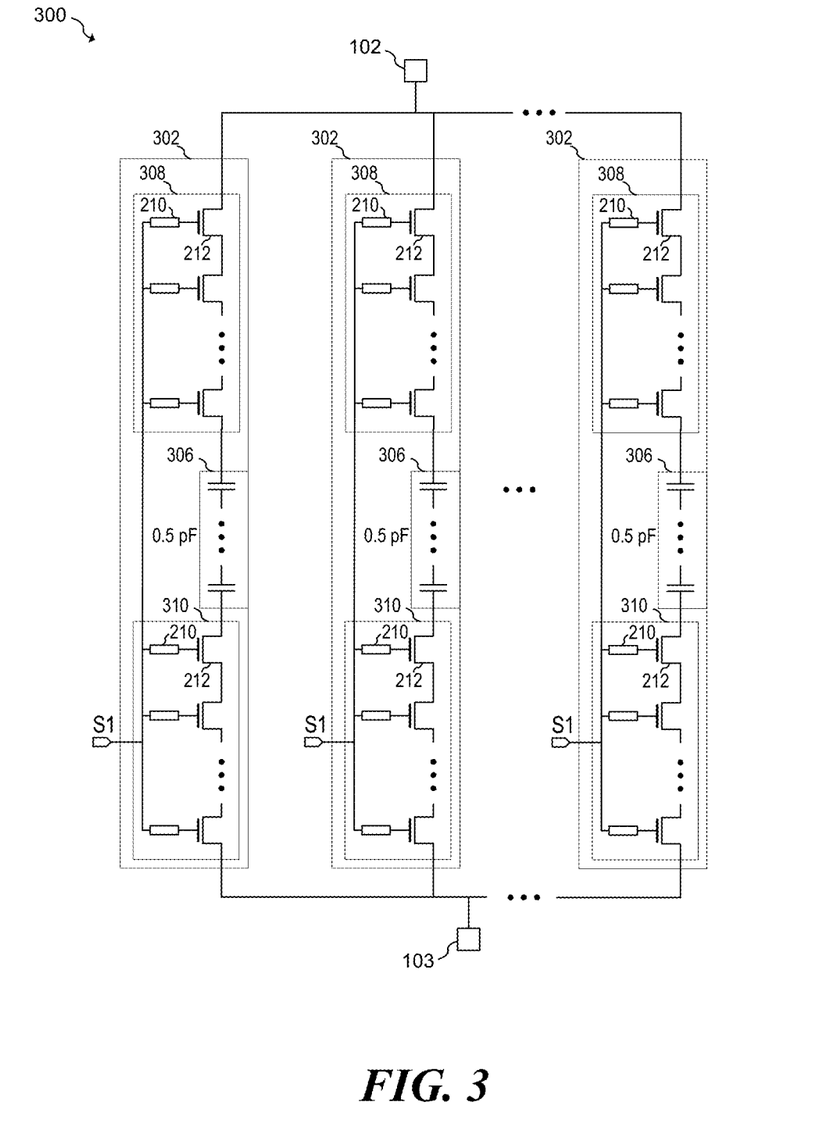
FIG. 3 illustrates a schematic of another embodiment of a digitally tunable capacitance.

FIG. 3 illustrates an embodiment digitally tunable capacitor circuit 300 according to an alternative embodiment of the present invention. As illustrated, each capacitance-switch cell 302 includes capacitance 306 coupled between switching circuits 308 and 310. By coupling capacitance 306 between switches 308 and 310, ESD protection may be provided to the capacitors within capacitance circuit 306 via switches 310. If an ESD pulse is applied to pads 102 and/or 103, parasitic NPN transistors within transistors are activated in the presence of a high voltage. In one example, if a positive ESD voltage is applied across pads 102 and 103, avalanche breakdown within transistors 212 shunt ESD current to the substrate. On the other hand, if a negative ESD voltage is applied, diode junctions formed by source/drain regions and the well and/or substrate become forward biased. In some embodiments, the ESD protection provided by transistors 212 is sufficient to protect capacitors 306 and no further ESD protection circuitry is needed.

Figure 4A:
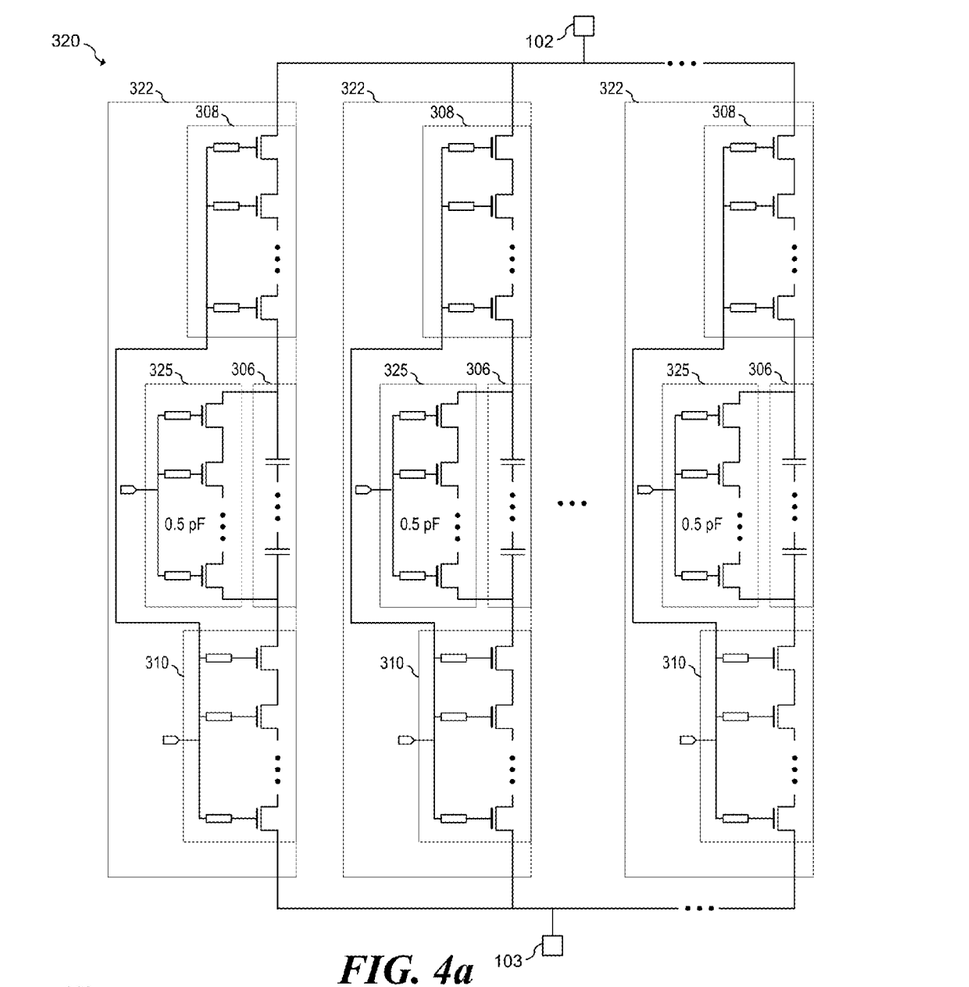
FIGS. 4a-b illustrate a schematic and corresponding cross-section of a digitally tunable capacitance having a bypass switch.

FIG. 4a illustrates an embodiment digitally tunable capacitor circuit 320 according to a further embodiment of the present invention. Similar to FIG. 3, each capacitance-switch cell 322 includes capacitance 306 coupled between switching circuits 308 and 310. In addition, capacitance-switch cell 322 includes bypass switch 325 coupled in parallel with capacitance 306, which may be used to operate digitally tunable capacitor circuit 320 in a bypass mode. In some embodiments, a bypass mode may be used to reduce the required tuning range. For example, instead of applying a very high capacitance (e.g. 15 pF in 2 GHz) which does not have a severe matching effect, bypassing the capacitance would have a similar effect. As such, the tuning range may be reduced to smaller capacitance values, for example, between about 0.5 pF and about 5 pF. Hence, digitally tunable capacitance circuit 320 has a generally improved Q factor due to the smaller capacitance values. Furthermore, switching transistors may be reused that have, for example, a very high transistor width and a low Ron. Digitally tunable capacitor circuit 320 may also be applied to a band selective circuit. In some embodiments, bypassing the capacitance can be used to avoid high-frequency LC resonances when the system utilizing digitally tunable capacitor circuit 320 is operating at lower frequencies.

Figure 4B:
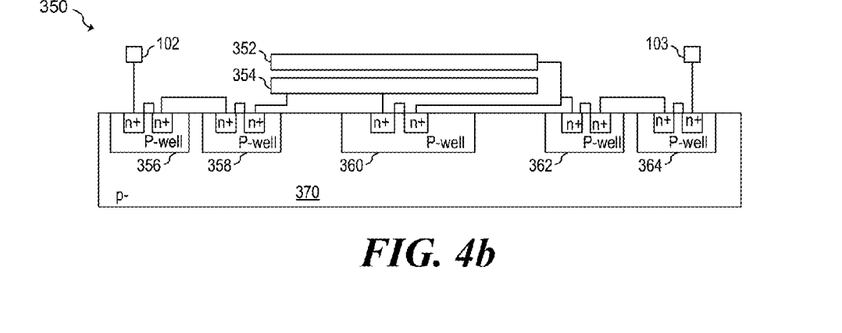

FIG. 4b illustrates a cross-sectional view 350 of an integrated circuit that may be used to implement an embodiment digitally tunable capacitor circuit. A MIM capacitor is implemented using metallization layers 352 and 354, the bottom plate of which is coupled to pad 102 via switching transistors 356 and 358, and the top plate of which is coupled to pad 103 via switching transistors 362 and 364. In alternative embodiments, other capacitor structures besides a MIM cap coupled may be used. For example, a capacitor having plates of one or more layers or poly-silicon or other layer may be used. Bypass switching transistor 360 may be disposed beneath the MIM cap. In some embodiments, the parasitic capacitance Coff of bypass switching transistor 360, when the transistor is turned off, may be used to supplement the capacitance of the MIM cap, thereby reducing die area needed to implement a particular capacitance value. Each switching transistor 356, 358, 360, 362 and 364 are shown as NMOS transistors having n+ source/drain regions disposed in p-wells within p-substrate 370. Connections between components are shown connected by simple wires for simplicity of illustration. It should be understood, however, that interconnect may be implemented using vias, and various metal and polysilicon layers as known in the art. In alternative embodiments, the MIM capacitors and switching transistors may be implemented differently, and may be implemented in different processes. For example, embodiments of the present invention may be implemented in a silicon-on-insulator (SOI) process, a process having an n-type substrate, or other process type.

Figure 5:
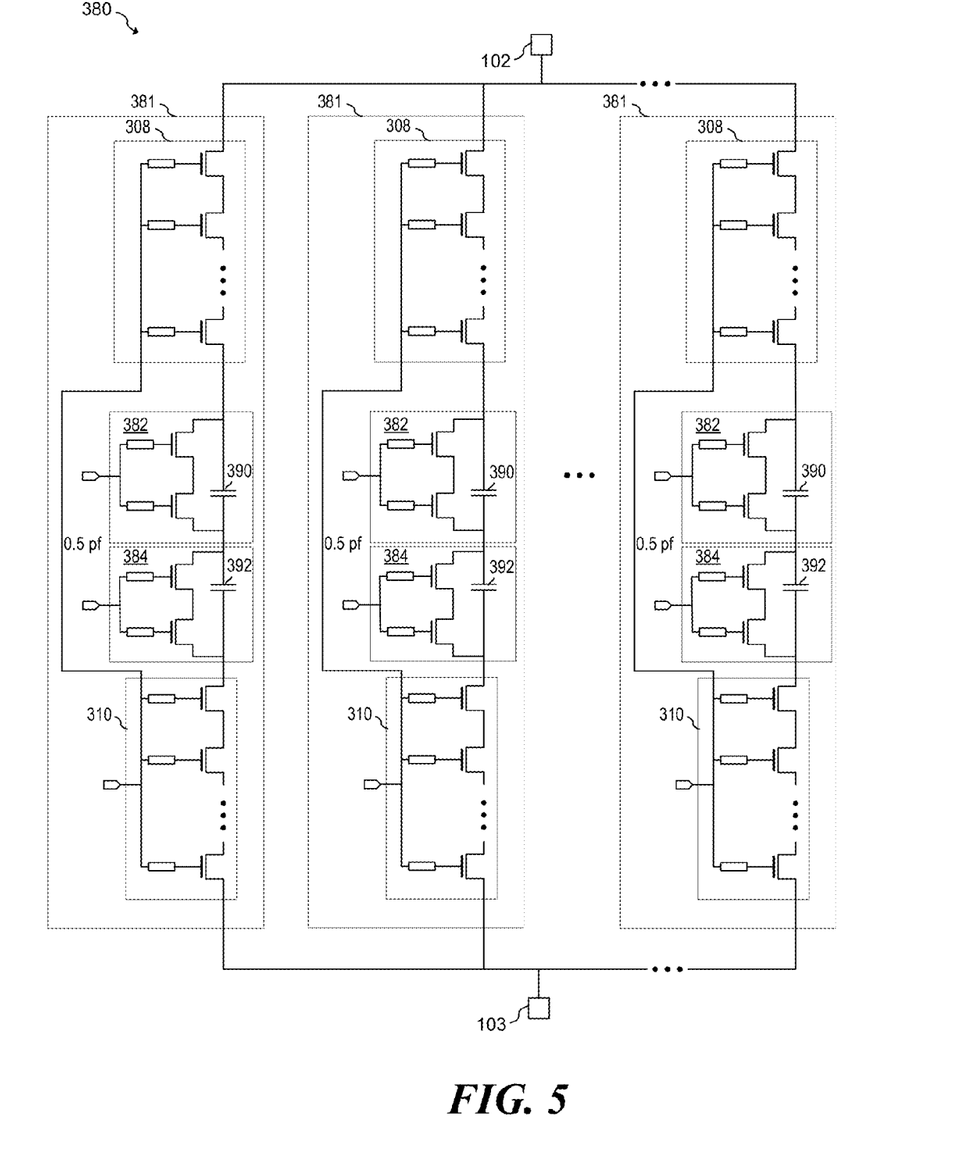
FIG. 5 illustrates another embodiment of a digitally tunable capacitance having a bypass switch.

FIG. 5 illustrates an embodiment digitally tunable capacitor circuit 380 that includes series capacitors 390 that are individually bypassed in blocks 382 and 384. By selectively bypassing capacitors 390 and 392, the capacitance of switched-capacitance blocks 381 may be further individually adjusted. As such, finer resolution capacitance tuning may be achieved while maintaining a high Q factors. In some embodiments, blocks 382 and 384 may be used to calibrate the capacitance vs. input word relationship of digitally tunable capacitor circuit 380. Such a calibration may be used, for example, to adjust for errors due to geometric mismatch or to correct process defects.

Figure 6:
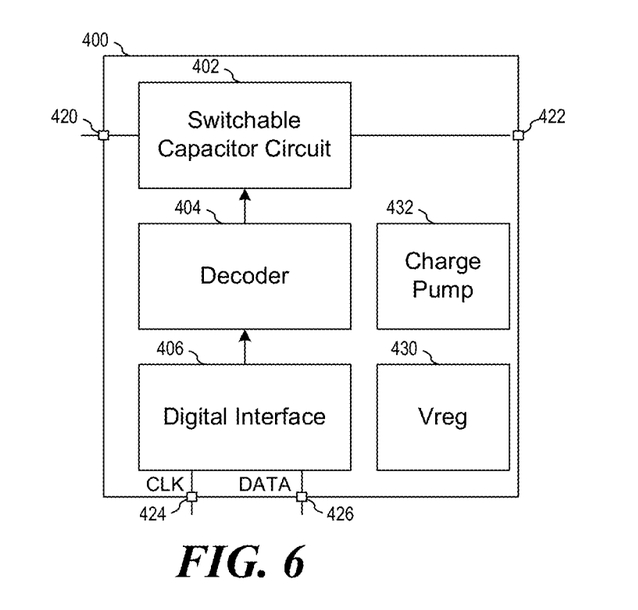
FIG. 6 illustrates a block diagram of an embodiment integrated circuit.

FIG. 6 illustrates a block diagram of an embodiment integrated circuit 400, which includes switchable capacitor circuit 402, digital decoder 404, on chip voltage regulator 430 and charge pump 432 for the switch transistors and digital interface 406. In an embodiment, switchable capacitor circuit 402 may be implemented according to the digitally tunable capacitance embodiments described above, and may be coupled, for example, to external RF circuits via pins 420 and 422. Digital interface 406 is shown implemented as a serial interface having a clock pin 424 and the data pin 426. The serial interface may be implemented, for example, using an SPI interface, and I2C interface, MIPI/RFFE or other serial interface known in the art. In alternative embodiments of the present invention, digital interface 406 may also be implemented using a parallel interface.

Decoder 404, which is coupled to an output of digital interface 406, converts a desired set of capacitance values from digital interface 406 to thermometer coded control signals that may be used to select the capacitor-switch branches within switchable capacitor circuit 402. In some embodiments, decoder 404 may also provide control signals that take into account calibrated values, as well as activating and deactivating various bypass modes. In embodiments, integrated circuit 400 may be packaged in a variety of different packages. In embodiments directed toward RF circuits, packages suitable for high frequency operation may be used. In some embodiments, integrated circuit 400 may be directly bump-bonded to a circuit board in order to reduce wiring inductance and other parasitics.

FIG. 7 illustrates an antenna matching system 500 according to an embodiment of the present invention. System 500 includes RF transmitter/receiver 502 coupled to antenna 508 via a matching network 510 that includes at least one embodiment switchable capacitor circuit. In embodiments, matching network 510 may transform an inductive impedance of antenna 508 to a less inductive and/or real impedance, for example 50Ω. RF transmitter/receiver 502 may be an RF front end in a cellular telephone, Wi-Fi transceiver, or other RF front end. In some embodiments, matching network 510 is adjusted in between transmitted and/or received data frames in order to adaptively match RF transmitter/receiver 502 to antenna 508 during operation of the RF system.

Figure 7A:
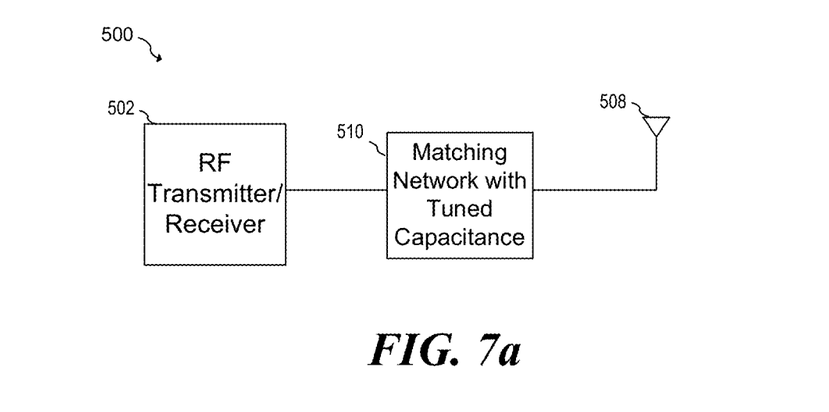
FIGS. 7a-e illustrates embodiment matching circuits and associated Smith Charts.
Figure 7B:
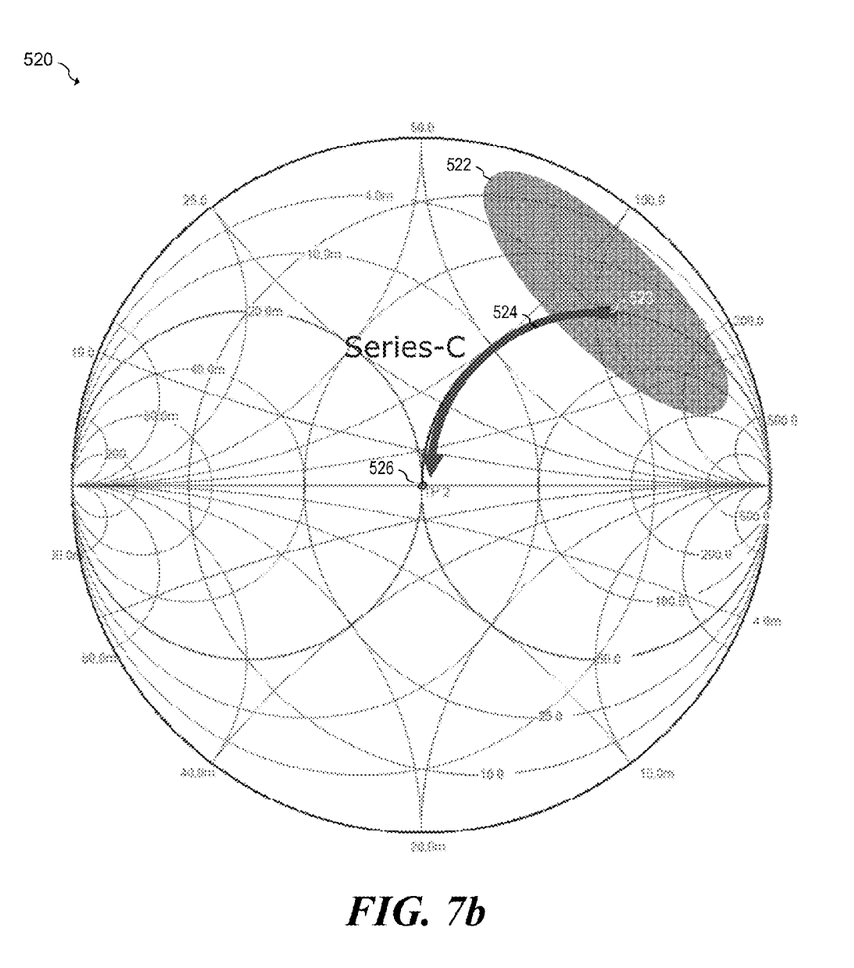

FIG. 7b illustrates a Smith chart 520 showing the principle of matching an inductive impedance, such as an antenna. As shown, region 522 represents a range of inductance of impedances that may be seen in a particular antenna, and point 523 within region 522 represents the inductive impedance of an antenna at a particular frequency of operation. Trajectory 524 represents the locus of impedances as the values of a series capacitance. At a particular capacitance, the trajectory 524 reaches the center of Smith chart 520 representing a real or matched impedance. The center point of Smith chat 510 may represent a 50Ω or other characteristic impedance depending on the system and its specifications.

Figure 7C:
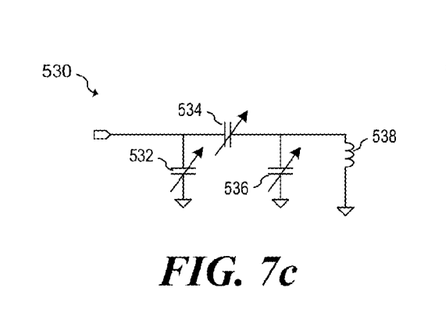
Figure 7D:
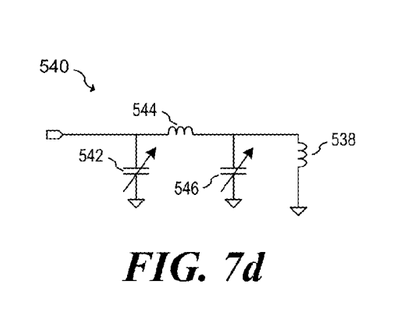

FIGS. 7c and 7d illustrate example matching networks that may be used to match an inductive antenna, which is represented as inductor 538. In FIG. 7c, a PI network 530 that includes embodiment digitally tunable capacitances 532, 534 and 536 are shown. In some embodiments, each of capacitances 532, 534 and 536 are implemented using tunable capacitor embodiments described above. Alternatively, one or more of capacitances 532, 534 and 536 may be implemented using a fixed capacitance. FIG. 7d illustrates a PI network 540 that includes embodiment digitally tunable capacitors 542 and 546 and inductor 544. In some embodiments, either capacitor 542 or capacitor 546 may be implemented using a fixed capacitance depending on the particular embodiments and its specifications.

Figure 7E:
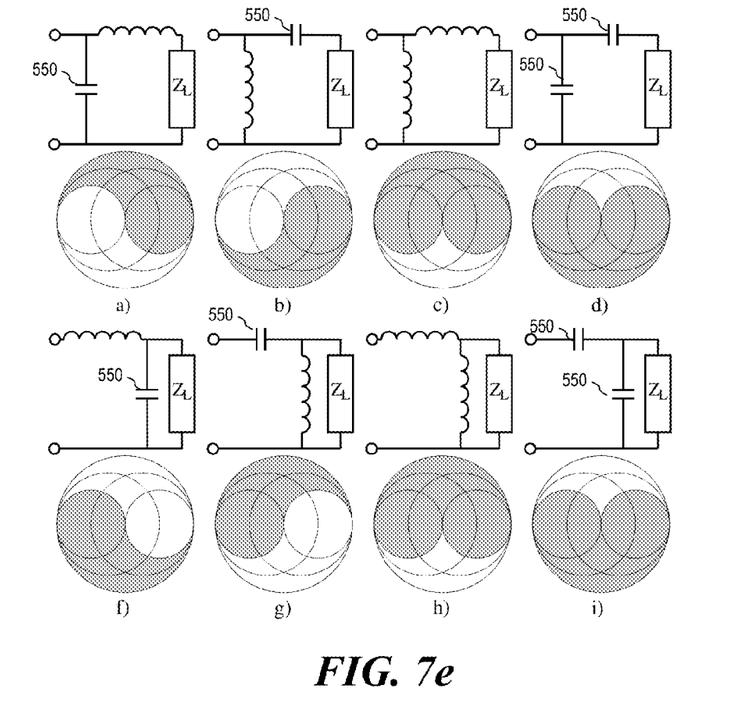

Alternatively, embodiment digitally tuned capacitance circuits may be applied toward other matching networks and topologies known in the art. FIG. 7e illustrates a number of matching topologies and associated Smith charts with filled-in regions that represent matchable impedances. Capacitive elements 550 shown in networks, a, b, d, f, g and i may be implemented using embodiment digitally tuned capacitance circuits. It should be understood that the embodiments of FIG. 7a-e are just a few embodiment examples of applications in which embodiment digitally tunable capacitances may be used. Embodiment digitally addressable capacitances may also be used, for example, in systems including, but not limited to other matching networks, tunable filters, and the like.

Figure 8:
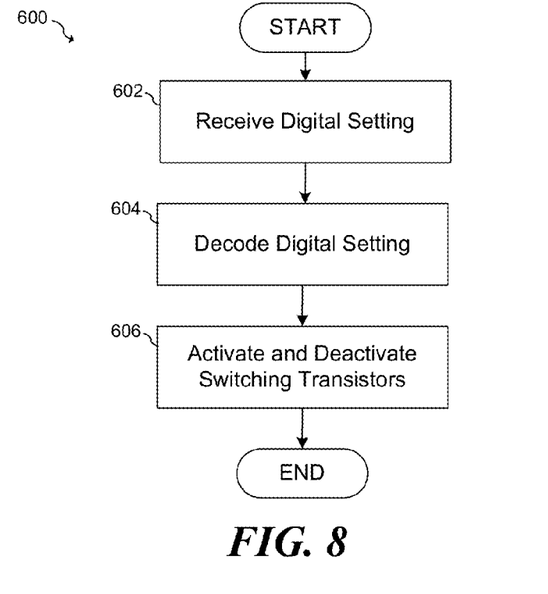
FIG. 8 illustrates a block diagram of an embodiment method.

FIG. 8 illustrates a method 600 of operating an embodiment digitally addressable capacitance. In step 602, a digital setting is received at a digital interface. This digital setting may be received, for example, from a serial interface, a parallel interface, or other digital interface. The digital setting may be addressed using a code that corresponds to the particular capacitance, or may be addressed using a code that corresponds to a difference in capacitance. The received digital setting may include a command to increase at a capacitance and/or to decrease the capacitance. In some embodiments, the received digital setting may be included within a digital word or frame that includes other information, such as configuration data, test data, or other system commands, such as comments requesting that the digitally addressable capacitance be placed in a bypass mode.

In step 604, the received digital setting is decoded. In some embodiments, a digital decoder may be used is known in the art. For example, a digital circuit configured to produce a thermometer code based on an input digital word may be used. This may be implemented, for example, using a lookup table, custom digital logic, or a value stored in a memory. In step 606, switching transistors within the capacitance-switch cell are activated and/or activated based on the decoded digital setting.

In accordance with an embodiment, a switchable capacitance circuit includes a plurality of capacitance-switch cells that each has a first semiconductor switching circuit and a capacitance circuit having a first terminal coupled to the first semiconductor switching circuit. A resistance of the first semiconductor switching circuit of a first switch-capacitance cell of the plurality of capacitance-switch cells is within a first tolerance of a resistance of the first semiconductor switching circuit of a second capacitance-switch cell of the plurality of capacitance-switch cells, and a capacitance of the capacitance circuit of the first capacitance-switch cell is within a second tolerance of a capacitance of the capacitance circuit of the second capacitance-switch cell. In some embodiments, the semiconductor switching circuit comprises a plurality of series connected semiconductor switches, and the capacitance circuit comprises a plurality of series connected capacitors. Each of the plurality of series connected semiconductor switches may include a transistor having a resistor coupled in series with a gate of the transistor.

In some embodiment switchable capacitance circuits, the first tolerance and the second tolerance are less 1%, and in some embodiments, a resistance of the first semiconductor switching circuit of a first switch-capacitance cell of the plurality of capacitance-switch cells is substantially equal to a resistance of the first semiconductor switching circuit of a second capacitance-switch cell of the plurality of capacitance-switch cells, and a capacitance of the capacitance circuit of the first capacitance-switch cell is substantially equal to a capacitance of the capacitance circuit of the second capacitance-switch cell.

In an embodiment, a number of series connected semiconductor switches is greater or equal to a maximum expected operating voltage of the switchable capacitance circuit divided by a maximum operating voltage of one of the semiconductor switches, and a number of the series connected capacitors is greater or equal to a maximum expected operating voltage of the switchable capacitance circuit divided by a maximum operating voltage of one of the series connected capacitors. In some cases, the maximum expected operating voltage may be greater than 50 V.

In an embodiment, each of the plurality of capacitance-switch cells further includes a second semiconductor switching circuit coupled to a second terminal of the capacitance circuit. The switchable capacitance circuit may further include a third semiconductor switching circuit having a first end coupled to the first terminal of the capacitance circuit and a second end coupled to the second terminal of the capacitance circuit. The capacitance circuit may include a metal-insulator-metal (MIM) capacitor, and the first semiconductor switching circuit may be disposed below the MIM capacitor.

In accordance with a further embodiment, a method of operating a switchable capacitance circuit includes increasing a load capacitance of the switchable capacitance circuit decreasing the load capacitance the load capacitance of the switchable capacitance circuit. Increasing the load capacitance includes switching-on at least one of a plurality of capacitance-switch cells. Each of the plurality of capacitance-switch cells includes a first semiconductor switching circuit and a capacitance circuit having a first terminal coupled to the first semiconductor switching circuit. A resistance of the first semiconductor switching circuit of a first capacitance-switch cell of the plurality of capacitance-switch cells is within a first tolerance of a resistance of the first semiconductor switching circuit of a second capacitance-switch cell of the plurality of capacitance-switch cells, and a capacitance of the capacitance circuit of the first capacitance-switch cell is within a second tolerance of a capacitance of the capacitance circuit of the second capacitance-switch cell. In an embodiment, switching-on includes activating the first semiconductor switching circuit of the at least one of the plurality of capacitance-switch cells. On the other hand, decreasing a load capacitance of the switchable capacitance circuit includes switching-off the at least of the plurality of capacitance-switch cells, wherein switching-off includes deactivating the first semiconductor switching circuit of the at least one of the plurality of capacitance-switch cell.

In some embodiment methods, the first tolerance and the second tolerance are less 1%, and in some embodiments, a resistance of the first semiconductor switching circuit of the first switch-capacitance cell of the plurality of capacitance-switch cells is substantially equal to a resistance of the first semiconductor switching circuit of the second capacitance-switch cell of the plurality of capacitance-switch cells, and the capacitance of the capacitance circuit of the first capacitance-switch cell is substantially equal to a capacitance of the capacitance circuit of the second capacitance-switch cell.

In an embodiment, activating the first semiconductor switching circuit of the at least one of the plurality of capacitance-switch cells further includes activating a plurality of semiconductor switches coupled in series. In some cases, each of the plurality of capacitance-switch cells further includes a second semiconductor switching circuit coupled to a second terminal of the capacitance circuit, and switching-on further includes activating the second semiconductor switching circuit of the at least one of the plurality of capacitance-switch cells.

Each of the plurality of capacitance-switch cells may further a bypass switch having a first end coupled to the first terminal of the capacitance circuit and a second end coupled to the second terminal of the capacitance circuit, and the method may further includes bypassing the switchable capacitance circuit by activating the first semiconductor switching circuit, the second semiconductor switching circuit and the bypass switch for at least one of the plurality of capacitance-switch cells.

In an embodiment, the method may further include applying a radio-frequency (RF) signal to the switchable capacitance circuit and/or coupling the switchable capacitance circuit to an antenna and tuning the antenna by increasing and decreasing the load capacitance of the switchable capacitance circuit. In further embodiments, the method may include receiving a command from a digital interface and decoding the command, such that increasing and decreasing the load capacitance further includes selectively activating the first semiconductor switching circuit of the plurality of capacitance-switch cells according to the decoded command.

In accordance with a further embodiment, a tunable radio-frequency (RF) circuit includes a semiconductor substrate and a plurality of capacitance-switch cells disposed on the semiconductor substrate. Each capacitance-switch cell includes a capacitance circuit, a first semiconductor switching circuit coupled between a first end of the capacitance circuit and a first output terminal of the RF circuit, and a second semiconductor switching circuit coupled between a second end of the capacitance circuit and a second output terminal of the RF circuit. A resistance of the first semiconductor switching circuit of a first capacitance-switch cell of the plurality of capacitance-switch cells is within a first tolerance of a resistance of the first semiconductor switching circuit of a second capacitance-switch cell of the plurality of capacitance-switch cells, and a capacitance of the capacitance circuit of the first capacitance-switch cell is within a second tolerance of a capacitance of the capacitance circuit of the second capacitance-switch cell.

In some embodiment RF circuits, the first tolerance and the second tolerance are less 1%, and in some embodiments, a resistance of the first semiconductor switching circuit of the first switch-capacitance cell of the plurality of capacitance-switch cells is substantially equal to a resistance of the first semiconductor switching circuit of the second capacitance-switch cell of the plurality of capacitance-switch cells, and the capacitance of the capacitance circuit of the first capacitance-switch cell is substantially equal to a capacitance of the capacitance circuit of the second capacitance-switch cell.

In an embodiment, the first semiconductor switching circuit includes a plurality of first transistors coupled in series, and the second semiconductor switching circuit includes a plurality of second transistors coupled in series. Each of the plurality of first transistors and each of the plurality of second transistors may include, for example, a MOS transistor and a resistor coupled in series with a gate of the MOS transistor. In some embodiments, the RF circuit further includes a first output pad coupled to the first output terminal of the RF circuit, and a second output pad coupled to the second output terminal of the RF circuit.

In an embodiment, each capacitance-switch cell may include a third semiconductor switching circuit coupled between the first end and the second end of the capacitance circuit. The capacitance circuit may include a metal-insulator-metal (MIM) capacitor, and the third semiconductor switching circuit may be disposed below the MIM capacitor.

Advantages of embodiments of the present invention include the ability to provide a digitally tunable capacitance that maintains a high Q factor that remains relatively constant over a wide range of selectable capacitor values. By providing a Q factor that remains relatively constant over various capacitances, algorithms used to provide dynamic matching to RF circuits may be simplified. For example, when matching and antenna to an RF front end, incrementing the capacitance when the Q factor remains relatively constant leads to predictable behavior at a next capacitance step, thereby simplifying the algorithm used to select capacitances and simplifying the design of the system. As such, an embodiment digitally addressable capacitance may be used in a variety of different systems in a predictable manner. For example, a single circuit may be applied to various types of antennas without the need for intensive redesign of a matching algorithm.

An additional advantage of embodiment digitally tunable capacitance circuits is that distortion behavior may be relatively constant over capacitance settings. As such, the harmonic and intermodulation distortion behavior of the RF system behaves predictably over various capacitance settings. Such predictable behavior allows for easier and more effective testing and evaluation, as well as simplified system design.

Further advantages of embodiments include the ability to implement a digitally controllable capacitance without any additional ESD protection circuitry beyond the ESD protection afforded by the switching transistors. As such, low capacitances may be realized without adding additional capacitance due to the presence of ESD devices.

A further advantage of embodiments includes the ability to efficiently implement a digitally tunable capacitance that operates under high voltage conditions. In embodiments having branches of relatively small capacitance, the resulting small coupling to the switch transistors when the switch transistors are off reduces the amplitude of the voltages seen by the switching transistors. As such, fewer series devices need to be coupled in series to prevent breakdown and device destruction. Using fewer series switching transistor devices leads to smaller die sizes, lower series resistance, and a higher Q factor is some embodiments.

Further advantages include reduced voltage stress to switching transistors in embodiments that have reduced capacitive coupling to switching transistors.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A switchable capacitance circuit comprising:
   a plurality of capacitance-switch cells coupled to a common terminal, wherein each capacitance-switch cell comprises:
      a first semiconductor switching circuit, and
      a capacitance circuit having a first terminal coupled to the first semiconductor switching circuit;
   wherein a resistance of the first semiconductor switching circuit of a first capacitance-switch cell of the plurality of capacitance-switch cells is substantially equal to a resistance of the first semiconductor switching circuit of a second capacitance-switch cell of the plurality of capacitance-switch cells, and a capacitance of the capacitance circuit of the first capacitance-switch cell is substantially equal to a capacitance of the capacitance circuit of the second capacitance-switch cell, and
   wherein each of the plurality of capacitance-switch cells are matched cells having a same geometry, wherein a Q factor of the switchable capacitance circuit is substantially monotonic as a load capacitance is increased and decreased by switching in and out ones of the plurality of capacitance-switch cells.

2. The switchable capacitance circuit of claim 1, wherein:
   the first semiconductor switching circuit comprises a plurality of series connected semiconductor switches; and
   the capacitance circuit comprises a plurality of series connected capacitors.

3. The switchable capacitance circuit of claim 2, wherein each of the plurality of series connected semiconductor switches comprises a transistor and a resistor coupled in series with a gate of the transistor.

4. The switchable capacitance circuit of claim 2, wherein
   a number of series connected semiconductor switches is greater or equal to a maximum expected operating voltage of the switchable capacitance circuit divided by a maximum operating voltage of one of the semiconductor switches; and
   a number of the series connected capacitors is greater or equal to a maximum expected operating voltage of the switchable capacitance circuit divided by a maximum operating voltage of one of the series connected capacitors.

5. The switchable capacitance circuit of claim 4, wherein the maximum expected operating voltage is greater than 50 V.

6. The switchable capacitance circuit of claim 1, wherein each of the plurality of capacitance-switch cells further comprises a second semiconductor switching circuit coupled to a second terminal of the capacitance circuit.

7. The switchable capacitance circuit of claim 6, further comprising a third semiconductor switching circuit having a first end coupled to the first terminal of the capacitance circuit and a second end coupled to the second terminal of the capacitance circuit.

8. The switchable capacitance circuit of claim 7, wherein:
   the capacitance circuit comprises a metal-insulator-metal (MIM) capacitor; and
   the first semiconductor switching circuit is disposed below the MIM capacitor.

9. A method of operating a switchable capacitance circuit, the method comprising:
   increasing a load capacitance of the switchable capacitance circuit comprising switching-on at least one of a plurality of capacitance-switch cells coupled to a common terminal, wherein
      each of the plurality of capacitance-switch cells comprises a first semiconductor switching circuit and a capacitance circuit having a first terminal coupled to the first semiconductor switching circuit, and
      a resistance of the first semiconductor switching circuit of a first capacitance-switch cell of the plurality of capacitance-switch cells is substantially equal to a resistance of the first semiconductor switching circuit of a second capacitance-switch cell of the plurality of capacitance-switch cells, and a capacitance of the capacitance circuit of the first capacitance-switch cell is substantially equal to a capacitance of the capacitance circuit of the second capacitance-switch cell,
      wherein each of the plurality of capacitance-switch cells are matched cells having a same geometry, and
      switching-on comprises activating the first semiconductor switching circuit of the at least one of the plurality of capacitance-switch cells; and
   decreasing the load capacitance of the switchable capacitance circuit comprising switching-off the at least of the plurality of capacitance-switch cells, wherein switching-off comprises deactivating the first semiconductor switching circuit of the at least one of the plurality of capacitance-switch cell, wherein a Q factor of the switchable capacitance circuit is substantially monotonic as the load capacitance is increased and decreased.

10. The method of claim 9, wherein activating the first semiconductor switching circuit of the at least one of the plurality of capacitance-switch cells further comprises activating a plurality of semiconductor switches coupled in series.

11. The method of claim 9, wherein:
   each of the plurality of capacitance-switch cells further comprises a second semiconductor switching circuit coupled to a second terminal of the capacitance circuit; and
   switching-on further comprises activating the second semiconductor switching circuit of the at least one of the plurality of capacitance-switch cells.

12. The method of claim 11, wherein:
   each of the plurality of capacitance-switch cells further comprises a bypass switch having a first end coupled to the first terminal of the capacitance circuit and a second end coupled to the second terminal of the capacitance circuit; and
   the method further comprises bypassing the switchable capacitance circuit, wherein bypassing comprises activating the first semiconductor switching circuit, the second semiconductor switching circuit and the bypass switch for at least one of the plurality of capacitance-switch cells.

13. The method of claim 9, further comprising applying a radio-frequency (RF) signal to the switchable capacitance circuit.

14. The method of claim 9, further comprising:
coupling the switchable capacitance circuit to an antenna; and
tuning the antenna by increasing and decreasing the load capacitance of the switchable capacitance circuit.

15. The method of claim 9, further comprising:
receiving a command from a digital interface; and
decoding the command, wherein increasing and decreasing the load capacitance further comprising selectively activating the first semiconductor switching circuit of the plurality of capacitance-switch cells according to the decoded command.

16. A tunable radio-frequency (RF) circuit comprising:
a semiconductor substrate; and
a plurality of capacitance-switch cells coupled to a common terminal and disposed on the semiconductor substrate, wherein each capacitance-switch cell comprises:
a capacitance circuit comprising a first end and a second end,
a first semiconductor switching circuit coupled between a first end of the capacitance circuit and a first output terminal of the RF circuit, and
a second semiconductor switching circuit coupled between a second end of the capacitance circuit and a second output terminal of the RF circuit;
wherein a resistance of the first semiconductor switching circuit of a first capacitance-switch cell of the plurality of capacitance-switch cells is substantially equal to a resistance of the first semiconductor switching circuit of a second capacitance-switch cell of the plurality of capacitance-switch cells, and a capacitance of the capacitance circuit of the first capacitance-switch cell is substantially equal to a capacitance of the capacitance circuit of the second capacitance-switch cell, wherein each of the plurality of capacitance-switch cells are matched cells having a same geometry, wherein a Q factor of a capacitance at the common terminal is substantially monotonic as a load capacitance is increased and decreased by switching in and out ones of the plurality of capacitance-switch cells.

17. The RF circuit of claim 16, wherein:
the first semiconductor switching circuit comprises a plurality of first transistors coupled in series; and
the second semiconductor switching circuit comprises a plurality of second transistors coupled in series.

18. The RF circuit of claim 17, wherein each of the plurality of first transistors and each of the plurality of second transistors comprises a MOS transistor and a resistor coupled in series with a gate of the MOS transistor.

19. The RF circuit of claim 16, further comprising:
a first output pad coupled to the first output terminal of the RF circuit; and
a second output pad coupled to the second output terminal of the RF circuit.

20. The RF circuit of claim 16, wherein each capacitance-switch cell comprises a third semiconductor switching circuit coupled between the first end and the second end of the capacitance circuit.

21. The RF circuit of claim 20, wherein:
the capacitance circuit comprises a metal-insulator-metal (MIM) capacitor; and
the third semiconductor switching circuit is disposed below the MIM capacitor.

* * * * *